(12) United States Patent
Tokano et al.

(10) Patent No.: US 7,714,385 B2
(45) Date of Patent: May 11, 2010

(54) SEMICONDUCTOR DEVICE AND METHOD OF FABRICATING THE SAME

(75) Inventors: Kenichi Tokano, Kawasaki (JP); Hiroyuki Sugaya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 662 days.

(21) Appl. No.: 11/615,167

(22) Filed: Dec. 22, 2006

(65) Prior Publication Data
US 2007/0148931 A1 Jun. 28, 2007

(30) Foreign Application Priority Data
Dec. 26, 2005 (JP) ............... 2005-372739

(51) Int. Cl.
*H01L 29/76* (2006.01)
(52) U.S. Cl. ............... 257/341; 257/E29.257
(58) Field of Classification Search ............. 257/335, 257/341, E29.257, 622, 627
See application file for complete search history.

(56) References Cited

U.S. PATENT DOCUMENTS 7,595,530 B2 * 9/2009 Tokano et al. ............... 257/335

2002/0158301 A1 10/2002 Urakami et al.
2004/0016959 A1 1/2004 Yamaguchi et al.
2005/0221547 A1 10/2005 Yamauchi et al.

FOREIGN PATENT DOCUMENTS

| JP | 2001-351865 | 12/2001 |
|----|-------------|---------|
| JP | 2003-124464 | 4/2003 |
| JP | 2005-317905 | 11/2005 |

* cited by examiner

*Primary Examiner*—Mark Prenty
(74) *Attorney, Agent, or Firm*—Oblon, Spivak, McClelland, Maier & Neustadt, L.L.P.

(57) ABSTRACT

A semiconductor device, including a first semiconductor layer of the first conductivity type having a plurality of trenches formed therein. A second semiconductor layer of the second conductivity type composed of an epitaxial layer is buried in the trenches in the first semiconductor layer. The trench has surface orientations including a surface orientation of a sidewall at an upper stage made slower in epitaxial growth speed than a surface orientation of a sidewall at a lower stage.

11 Claims, 10 Drawing Sheets

US 7,714,385 B2

SEMICONDUCTOR DEVICE AND METHOD OF FABRICATING THE SAME

CROSS REFERENCE TO RELATED APPLICATION

This application is based on and claims the benefit of prior Japanese Patent Application No. 2005-372739, filed on Dec. 26, 2005, the entire contents of which are incorporated herein by reference.

BACKGROUND OF THE INVENTION

1. Field of the Invention

The present invention relates to a semiconductor device, which has a structure that includes an epitaxial layer buried in trenches formed in a semiconductor layer, and method of fabricating the same.

2. Description of the Related Art

In recent years, an SJ (Super Junction)-MOSFET has been known as one of low-loss power semiconductor devices. The SJ-MOSFET has a superjunction structure in a drift layer as a structure that satisfies a low on-resistance and a high breakdown voltage of a power MOSFET at the same time. In the SJ-MOSFET, trenches are formed in an n-type epitaxial layer periodically along the plane, and a p-type epitaxial layer is formed in these trenches. To form such the periodic structure, an n-type drift layer is formed on an n-type substrate by epitaxial growth, and deep trenches are formed in the n-type drift layer by an isotropic etching. Next, a p-type resurf layer is formed in the trenches by epitaxial growth. Then, the surface is planarized by CMP (Chemical Mechanical Polishing) to expose the n-type drift layer to the surface (JP-A 2003-124464, paragraphs 0047-0048, FIGS. 2-5).

As fine pattering of the element proceeds and the aspect ratio of the trench increases, the growth speed of silicon at the time of epitaxial growth may become slower at the interior of the trench than at the entry to the trench. In this case, a void may arise inside the p-type resurf layer buried in the trenches. When such the void is exposed to the surface of the semiconductor layer in the planarization step by CPM and results in a problem associated with mixture of dusts into the void, a problem arises because the delivery to the post step can not be achieved.

SUMMARY OF THE INVENTION

In one aspect the present invention provides a semiconductor device, comprising: a semiconductor substrate; a first semiconductor layer of a first conductivity type formed on the semiconductor substrate and having a first trench formed therein, the first trench having an upper sidewall at an upper stage and a lower sidewall at a lower stage; and a second semiconductor layer of a second conductivity type, the second semiconductor layer being buried in the trench in the first semiconductor layer, wherein the first trench has surface orientations including a first surface orientation of the upper sidewall made slower in epitaxial growth speed than a second surface orientation of the lower sidewall.

In one aspect the present invention provides a method of fabricating a semiconductor device, comprising: forming a first trench in a first semiconductor layer of a first conductivity type such that the first trench has surface orientations including a first surface orientation of a sidewall an upper sidewall made slower in epitaxial growth speed than a second surface orientation of a lower sidewall; forming by epitaxial growth a second semiconductor layer of the second conductivity type in the first trench and on an upper surface of the first semiconductor layer; and polishing an upper surface of the second semiconductor layer to expose the upper surface of the first semiconductor layer.

DETAILED DESCRIPTION OF THE INVENTION

Semiconductor devices and methods of fabricating the same according to embodiments of the present invention will now be described below with reference to the accompanying drawings.

First Embodiment

Figure 1:
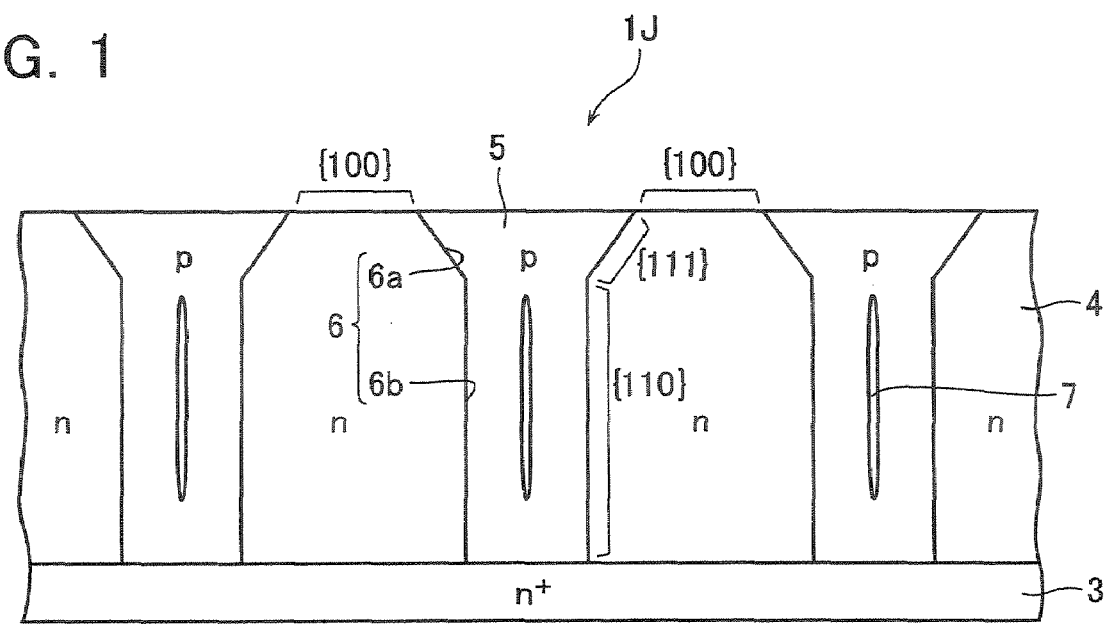
FIG. 1 is a vertical cross-sectional view of a semiconductor device in a step during fabrication according to a first embodiment of the present invention.

FIG. 1 is a partial vertical cross-sectional view of a semiconductor device, or an vertical SJ-MOSFET, during a fabrication process according to a first embodiment of the present invention. This semiconductor device 1J is configured as follows. An $n^+$-type semiconductor substrate 3 (such as a silicon substrate) serves as a drain layer, on which an n-type first semiconductor layer 4 is disposed. A plurality of deep trenches 6 are formed periodically along the plane of the first semiconductor layer 4, and a p-type second semiconductor layer 5 is buried in the trenches 6 by epitaxial growth. A void 7 may possibly arise inside the second semiconductor layer 5 during the process of fabricating the semiconductor device 1J while this embodiment allows such the void to arise. The trench 6 is an elongated groove extending in the direction perpendicular to the page, or a groove having a square or rectangular lateral section. The trench 6 is defined by a V-grooved upper stage sidewall 6a made wider toward the aperture and a lower stage sidewall 6b formed beneath the sidewall 6a as almost perpendicular to the bottom. The upper stage sidewall 6a has a surface orientation of substantially {111} for example while the lower stage sidewall 6b has a surface orientation of substantially {110} for example.

The n-type is herein an example of the first conductivity type while the p-type is an example of the second conductivity type. In the description of this embodiment, n and $n^+$ are employed to denote the n-type, and $n^+$ indicates a higher n-type impurity concentration relative to n. Similarly, as for the p-type, $p^+$ indicates a higher p-type impurity concentration relative to p.

The following description is given to the effect of the semiconductor device thus configured. In general, a growth speed of silicon in a process of epitaxial growth differs from another depending on the surface orientation of a plane subjected to silicon growth, and the speed varies in relation to $\{100\}>\{110\}>>\{111\}$. In this example, the upper stage sidewall 6a of the trench 6 has a surface orientation of substantially $\{111\}$ and the lower stage sidewall 6b has a surface orientation of substantially $\{110\}$. As a result, the lower stage sidewall 6b with a faster silicon growth speed can sufficiently grow silicon until the aperture of the trench 6 is closed by silicon growth from the upper stage sidewall 6a with a slower silicon growth speed. Thus, it is possible to prevent the occurrence of the void 7 that arises inside the second semiconductor layer 5 if the silicon growth is insufficient. Even if a void 7 arises, the void 7 cannot be exposed to the surface of the semiconductor device 1J.

Figure 2:
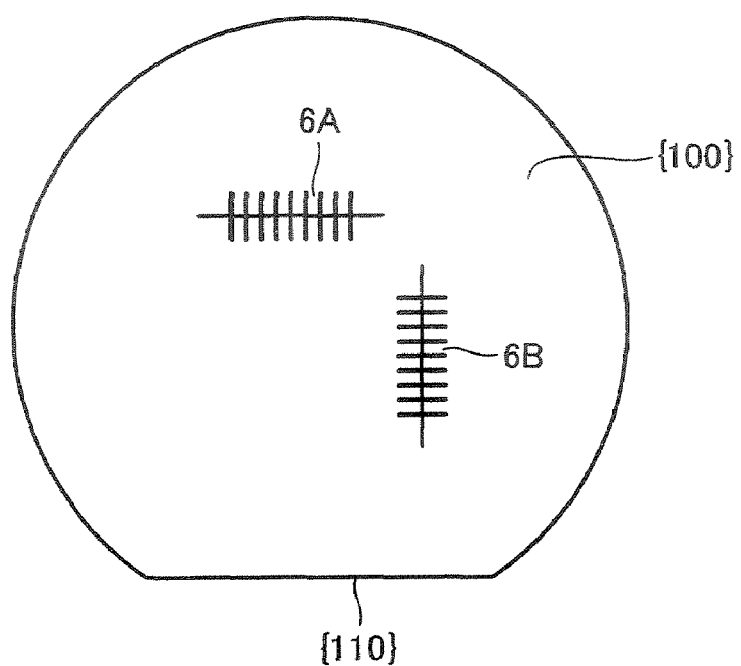
FIG. 2 is a plan view of a semiconductor substrate associated with the same device.

Such the semiconductor device can be fabricated by using as the semiconductor substrate a silicon wafer having a crystal orientation of substantially $\{100\}$ and an orientation flat direction of substantially $\{110\}$ as shown in FIG. 2; forming the first semiconductor layer 4 on the wafer by epitaxial growth; and forming trenches 6A, 6B having sidewalls almost parallel with or almost perpendicular to the surface orientation of the orientation flat. In this specification, $\{100\}$, $\{110\}$ and $\{111\}$ do not always mean the surface orientation in the strict sense but tolerate errors more or less within a range that allows sufficient achievements of the above effect. In general, the principal plane of the silicon wafer and the orientation of the orientation flat may have errors of $\pm 1°$, and the rotational direction of the silicon wafer and the trench formation in depth may have errors of $\pm 1°$, respectively. In such the case, if a margin is considered more or less, the extent of around $\pm 6°$ can fall within a sufficiently tolerable range for these surface orientations.

FIGS. 3-15 are referenced next to describe the process steps of fabricating the semiconductor device 1 (SJ-MOSFET). In FIGS. 3-15, the reference symbols 1A-1M denote the semiconductor device in different process steps.

Figure 3:
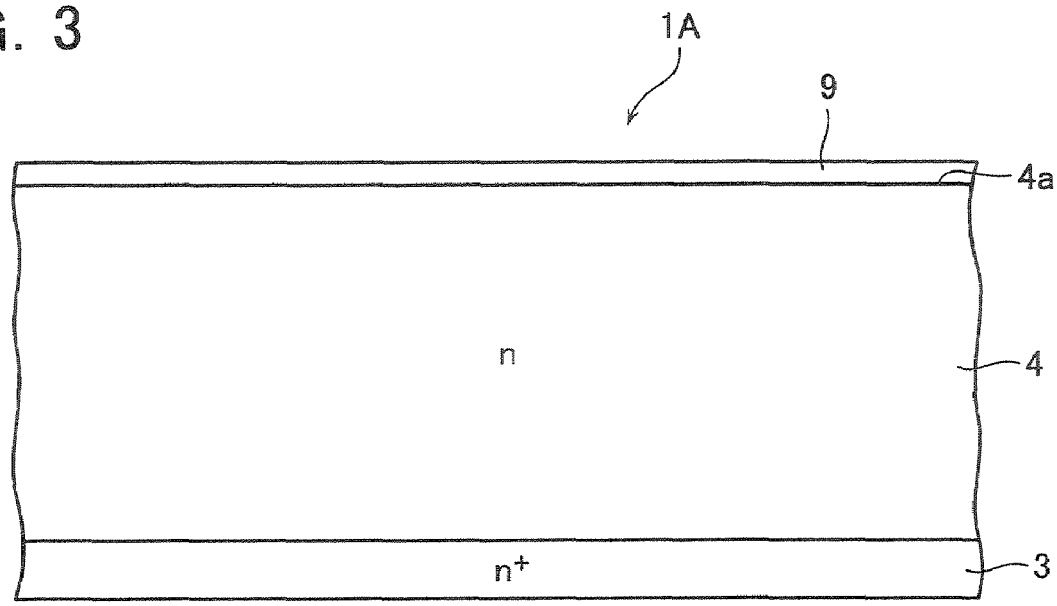
FIG. 3 is a view of the first step in a method of fabricating the semiconductor device according to the first embodiment.

First, an n-type semiconductor is epitaxially grown from the $n^+$-type semiconductor substrate 3 having a crystal orientation of substantially $\{100\}$ and an orientation flat direction of substantially $\{110\}$ as shown in FIG. 3 to form the first semiconductor layer 4. As a result, the first semiconductor layer 4 has a principal plane 4a of substantially $\{100\}$. A first mask material 9 such as an silicon oxide is then formed on the formed first semiconductor layer 4.

Figure 4:
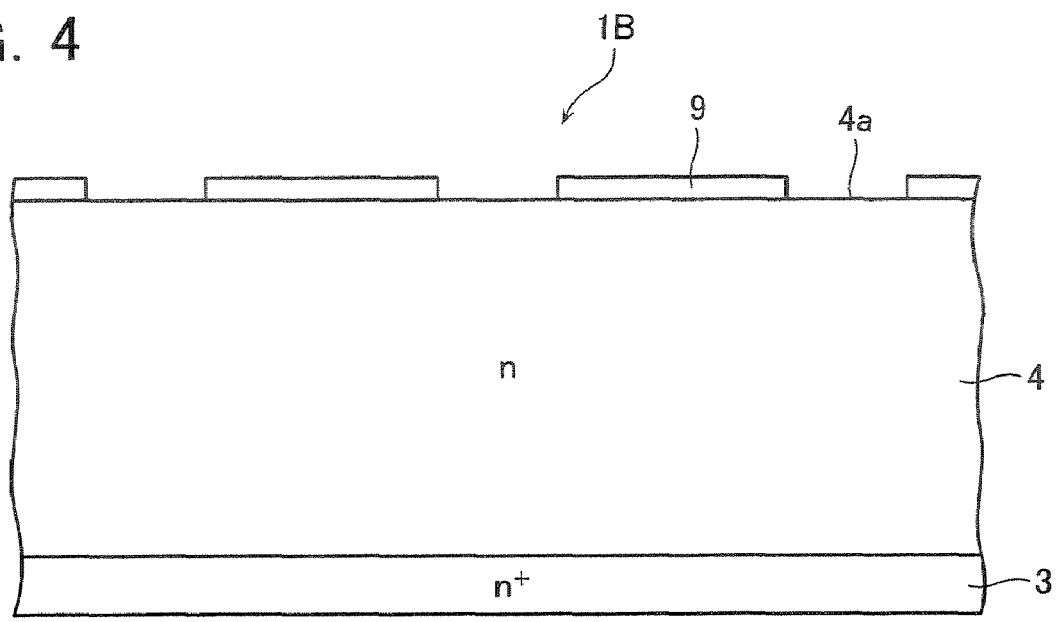
FIG. 4 is a view of the second step in the same method.
Figure 5:
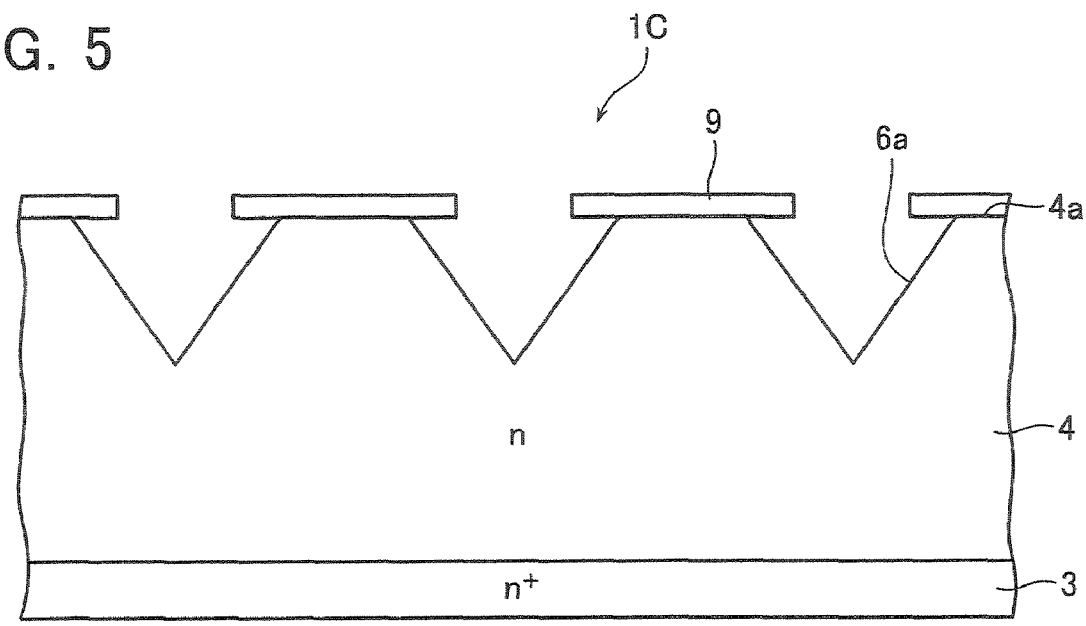
FIG. 5 is a view of the third step in the same method.

The first mask material 9 is then selectively etched as shown in FIG. 4 to expose the principal plane 4a of the first semiconductor layer 4 periodically at certain intervals. Subsequently, an anisotropic wet etching is applied using an aqueous solution of KOH as an etchant as shown in FIG. 5 to form the V-grooved upper stage sidewall 6a that forms an angle of about 55° from the principal plane 4a. This V-groove is formed because the etching speed varies depending on the crystal plane ($\{100\}>>\{111\}$) and the $\{111\}$ plane with a slower etching speed finally remains as the etching proceeds.

The process of etching naturally stops at the terminal point where the $\{111\}$ planes intersect together. Thus, the V-grooved upper stage sidewall 6a having the surface orientation of $\{111\}$ can be formed. The distance in depth direction of the V-grooved upper stage sidewall 6a can be controlled through adjustment of the aperture width of the first mask material 9.

Figure 6:
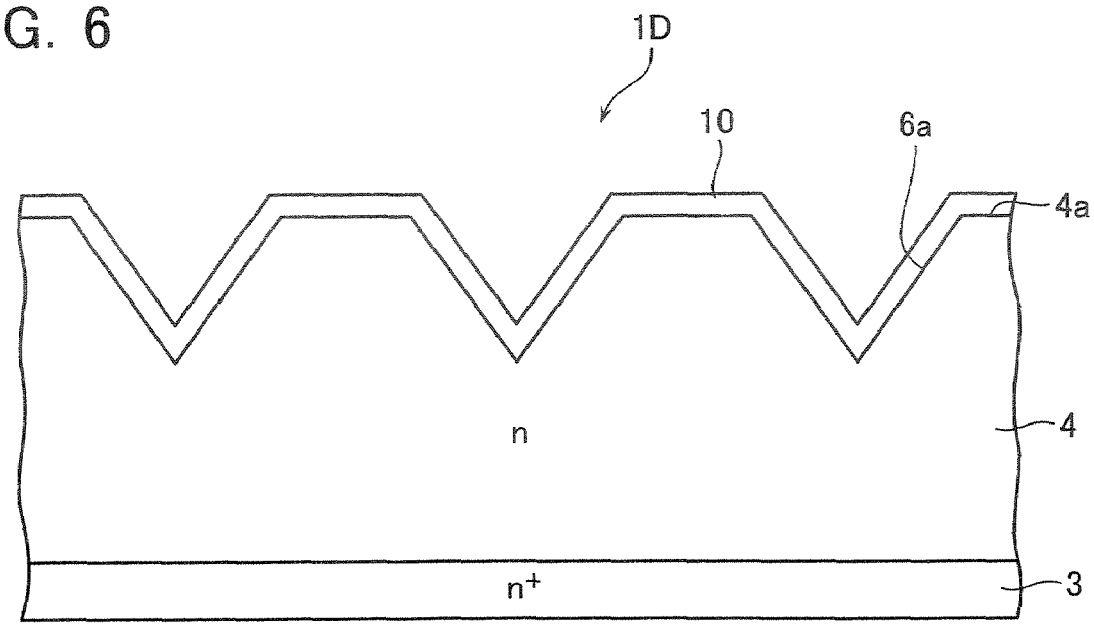
FIG. 6 is a view of the fourth step in the same method.
Figure 7:
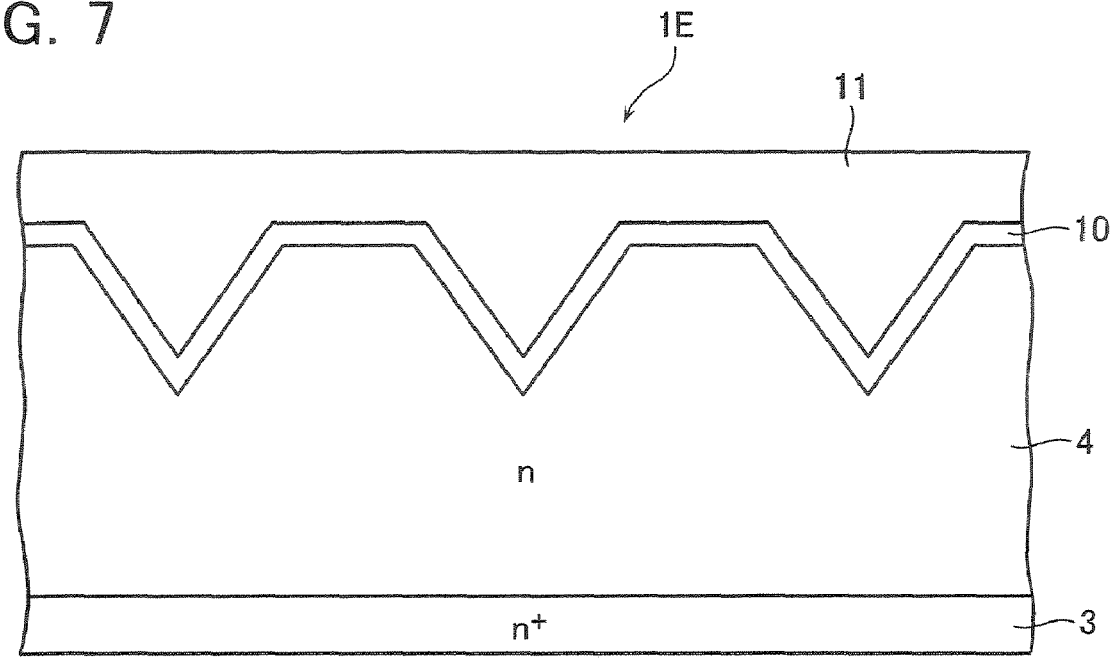
FIG. 7 is a view of the fifth step in the same method.
Figure 8:
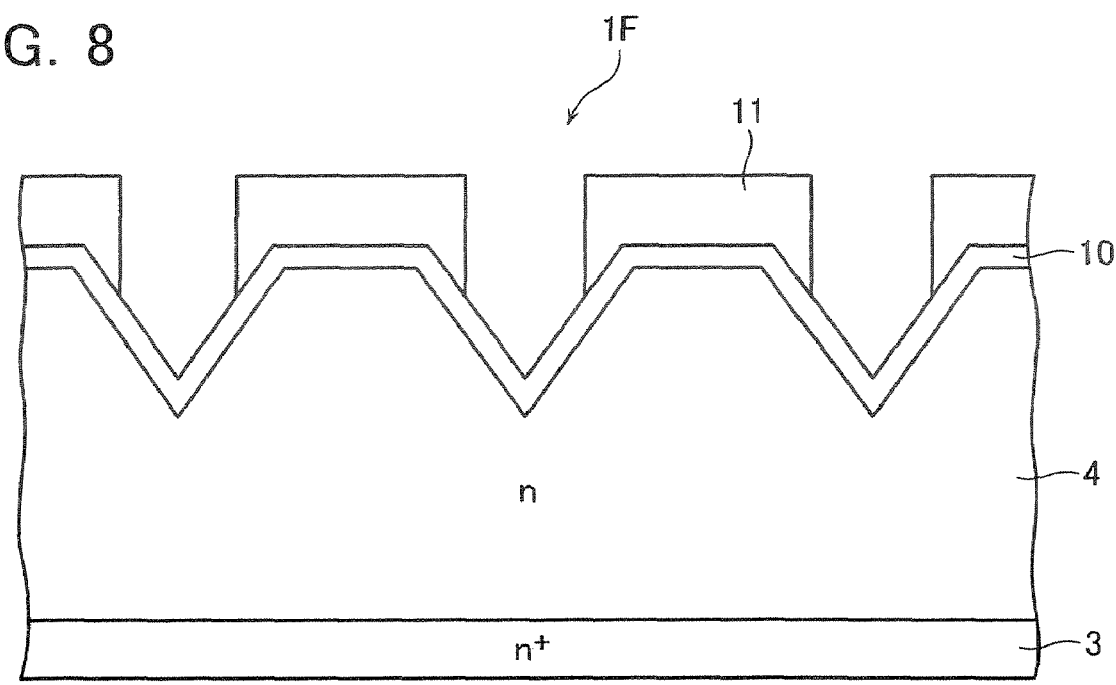
FIG. 8 is a view of the sixth step in the same method.
Figure 9:
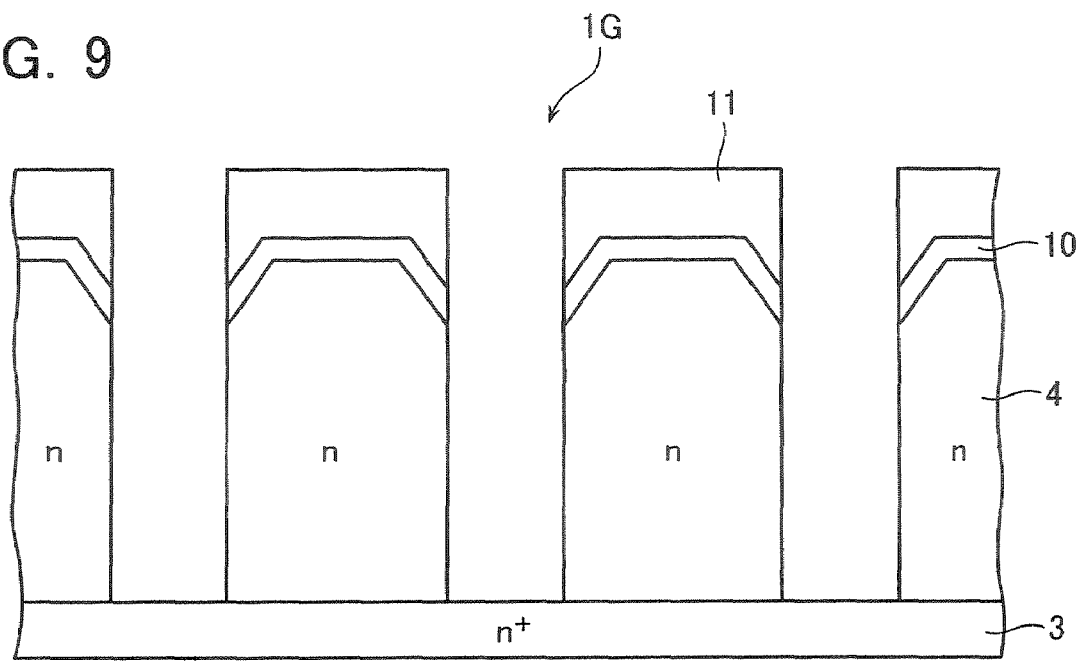
FIG. 9 is a view of the seventh step in the same method.

Next, the first mask material 9 is removed as shown in FIG. 6 and then a second mask material 10, or a silicon oxide film, is formed over the principal plane 4a and the upper stage sidewall 6a. Further, a third mask material 11 composed of resist is applied over the second mask material 10 as shown in FIG. 7. Subsequently, the third mask material 11 is patterned as shown in FIG. 8. The patterned third mask material 11 is then used as a mask to apply an anisotropic dry etching such as RIE (Reactive Ion Etching) for vertically etching the first semiconductor layer 4 as shown in FIG. 9 to form the lower stage sidewall 6b.

Figure 10:
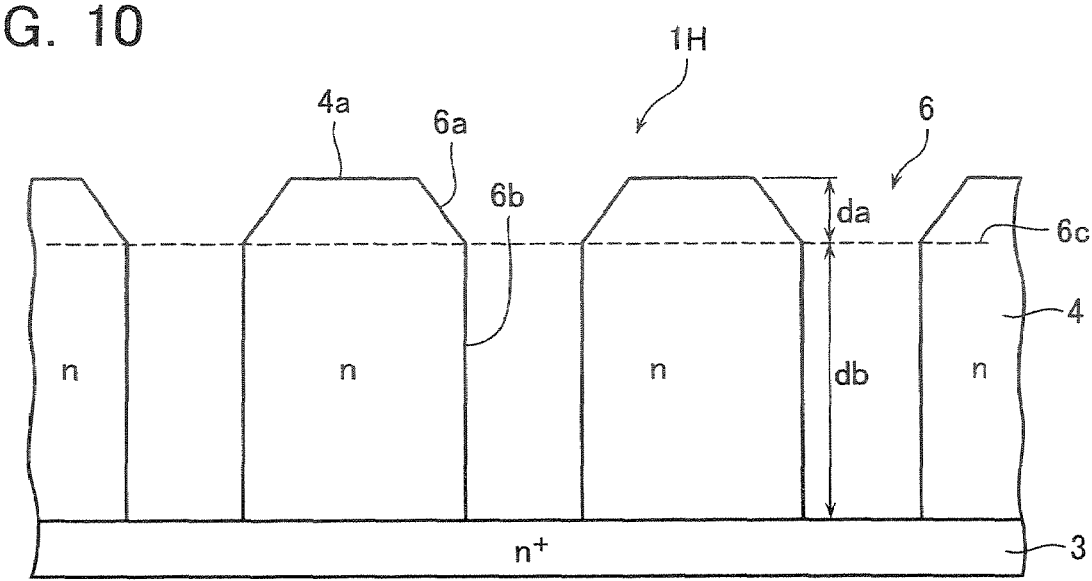
FIG. 10 is a view of the eighth step in the same method.

Further, the second and third mask materials 10, 11 are removed as shown in FIG. 10 to form the trenches 6 with the upper stage sidewall 6a having the surface orientation of substantially $\{111\}$ and the lower stage sidewall 6b having the surface orientation of substantially $\{110\}$. The trenches 6 are formed along a plane parallel with the principal plane 4a periodically and almost perpendicular to or almost parallel with the orientation flat direction.

The upper stage sidewall 6a of the trench 6 has a distance da in the depth direction. When a later-described base region 11 has a distance in the depth direction (a distance between its upper surface and its lower surface) of 4 μm, the distance da is made shallower than this, that is, of about 2 μm.

The lower stage sidewall 6b has a distance db in the depth direction of about 40 μm, for example. When the interval between adjacent trenches 6 is set at less than 12 μm, the distance da in the depth direction is preferably 0.5 μm or more, and 5 μm or less. The reason is as follows. When the distance da in the depth direction is 0.5 μm or more, a void 7 formed in the second semiconductor layer will not be exposed on the upper surface of the semiconductor device 1J.

On the other hand, when the distance da in the depth direction is 5 μm or less, it is possible to make the upper stage sidewalls 6a of the trenches 6, which face one another sandwiching the first semiconductor layer 4 not to overlap directly. In a word, the principal plane 4a of the first semiconductor layer 4 can exist. As a result, the upper surface of the second semiconductor layer 5 just after the growth is easy to be planarized.

Figure 11:
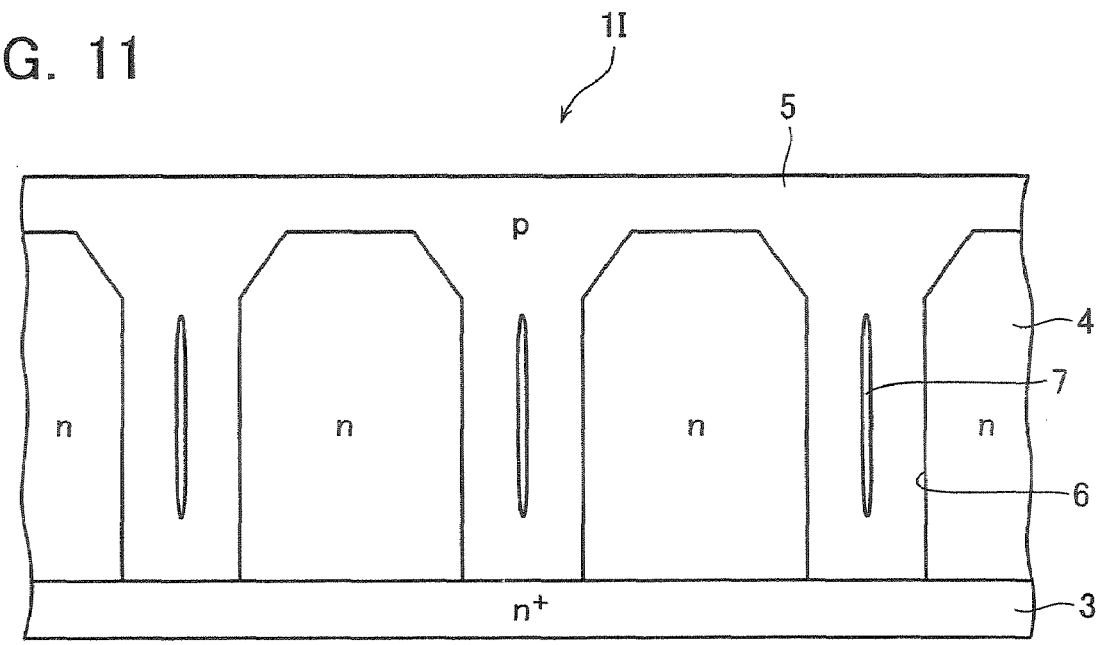
FIG. 11 is a view of the ninth step in the same method.

Next, a process of epitaxial growth is employed to grow silicon inside the trenches 6 and on the principal plane 4a of the first semiconductor layer 4 as shown in FIG. 11 to form the p-type second semiconductor layer 5. The process of epitaxial growth uses dichlorosilane gas $SiH_2Cl_2$, for example, as raw material and is executed at a growth temperature of 900-1100° C. under a reduced pressure.

Available raw material may include mixed gas of dichlorosilane gas $SiH_2Cl_2$ and hydrochloric acid gas (HCl), silane gas $SiH_4$, trichlorosilane gas $SiHCl_3$, or a mixed gas of these gases and HCl. When silane gas is used, growth temperature may be set at a range of 850-1050 degrees Celsius. When trichlorosilane gas is used, growth temperature may be set at a range of 1050-1200 degrees Celsius.

Figure 12:
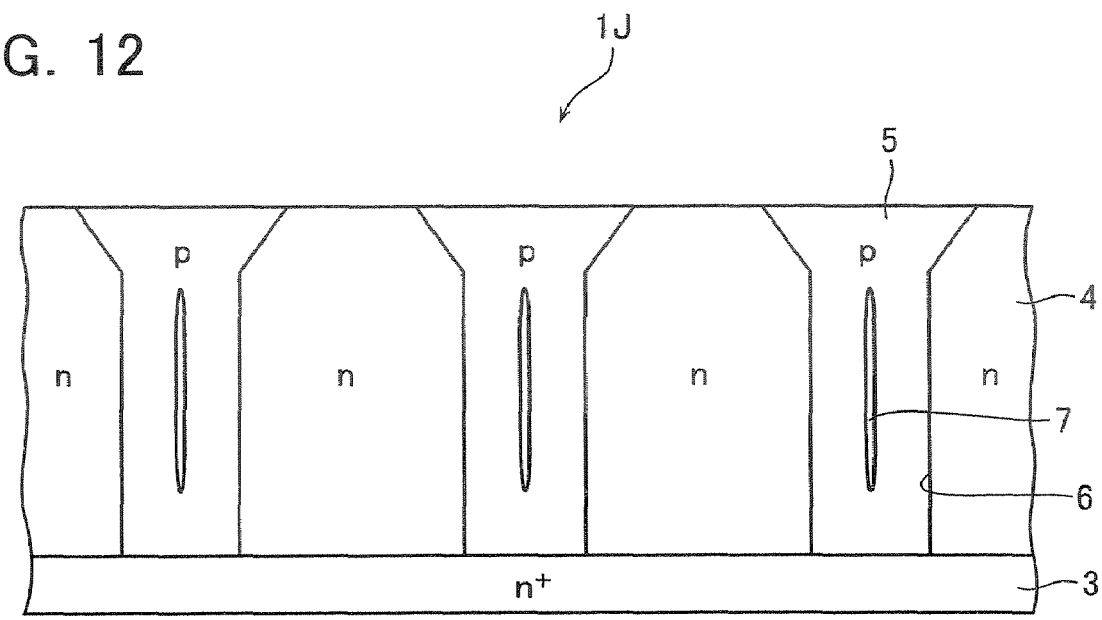
FIG. 12 is a view of the tenth step in the same method.

Subsequently, the surface of the second semiconductor layer 5 formed by epitaxial growth to cover the principal plane 4a of the first semiconductor layer 4 is planarized by CMP (Chemical Mechanical Polishing). As a result, the first semiconductor layer 4 and the second semiconductor layer 5 in the drift layer alternately appear in the surface of the semiconductor device 1J as shown in FIG. 12. In this case, a void 7 may arise inside the second semiconductor layer 5 at the silicon-growth-undeveloped portion such as the central portion possibly. This void 7 though locates at about 2 μm below the aperture of the trench 6. Therefore, even if the surface 4a of the first semiconductor layer 4 is polished more or less for planarization, the void 7 cannot be exposed to the upper surface of the semiconductor device 1J. Such polishing of the surface 4a of the first semiconductor layer 4 narrows the aperture width of the V-shaped trench 6 and accordingly reduces the pitch of the trenches 6 for fine patterning the element to the extent.

Figure 13:
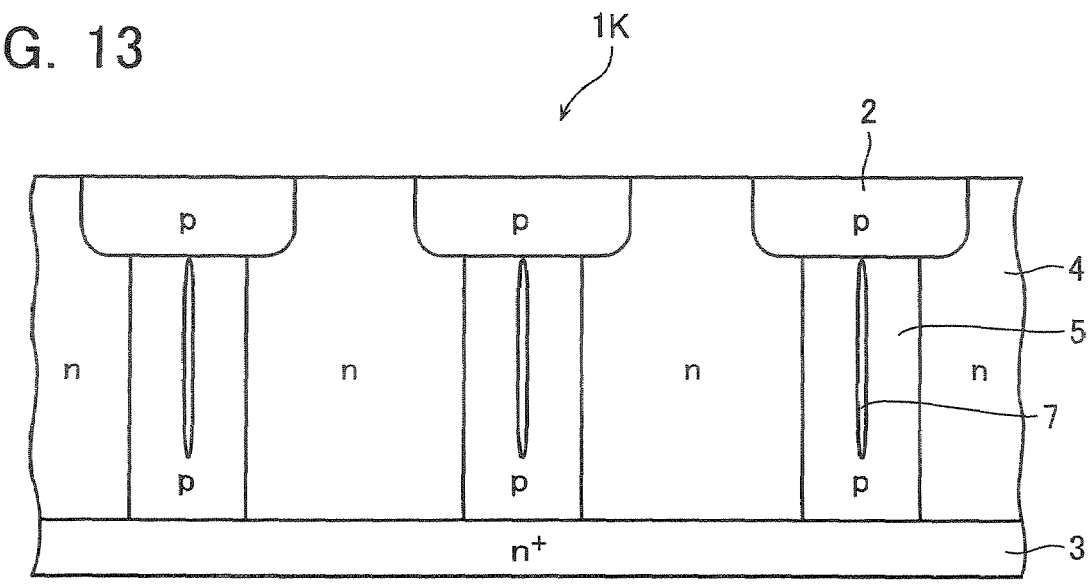
FIG. 13 is a view of the eleventh step in the same method.
Figure 14:
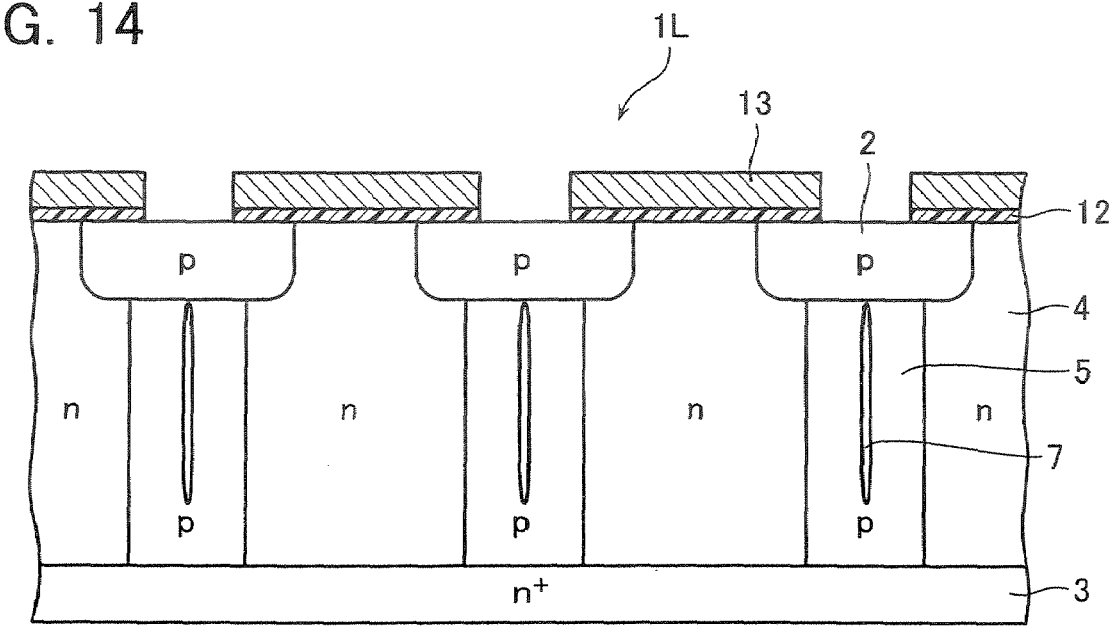
FIG. 14 is a view of the twelfth step in the same method.
Figure 15:
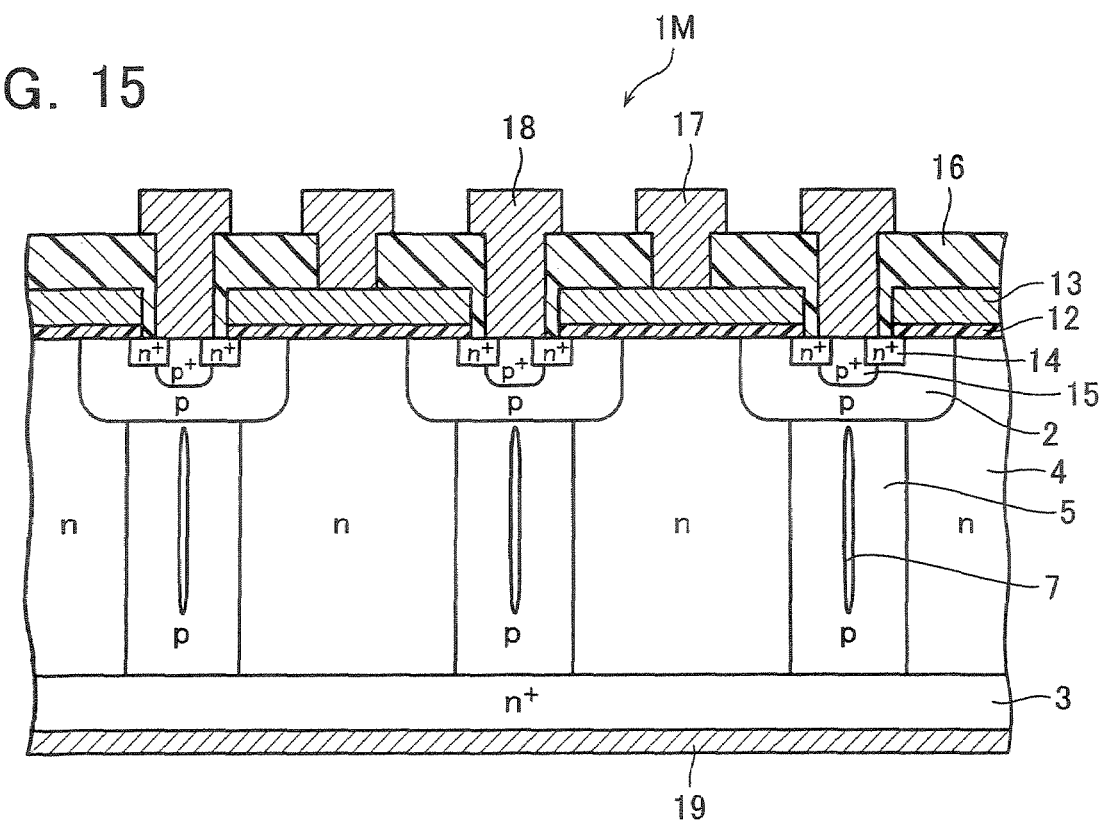
FIG. 15 is a view of the thirteenth step in the same method.

Ions are selectively implanted into the first semiconductor layer 4 and the second semiconductor layer 5 of the semiconductor device 1J thus configured with a mask of resist, not shown, to form a p-type base region 2 around the aperture of the trench 6 as shown in FIG. 13. In general, this base region 2 is wider than the second semiconductor layer 5, and extends over the first semiconductor layer 4 and the second semiconductor layer 5. Further, at a high oxidizing temperature, a silicon film to be turned into a gate insulator 12 is formed over the entire surfaces of the first semiconductor layer 4 and the base region 2. A polysilicon film to be turned into a gate electrode 13 is formed on the silicon film by, for example, CVD (Chemical Vapor Deposition). Thereafter, the silicon film and the polysilicon film are patterned to form the gate insulator 12 and the gate electrode 13 as shown in FIG. 14. This semiconductor device 1L is then subjected to publicly known technologies to form a source layer 14, a contact layer 15, an interlayer insulator 16, a gate lead 17, a source electrode 18 and a drain electrode 19 as shown in FIG. 15, thereby completing the semiconductor device 1M.

As for the semiconductor substrate 3 used in this embodiment, the surface orientation of the principal plane is substantially {100} and the orientation flat direction is substantially {110}. The surface orientation of the semiconductor substrate is though not limited and any semiconductor substrate can be employed so long as the surface orientation of the upper stage sidewall of the trench is substantially {111} and the surface orientation of the lower stage sidewall is substantially {110}.

Second Embodiment

Figure 16:
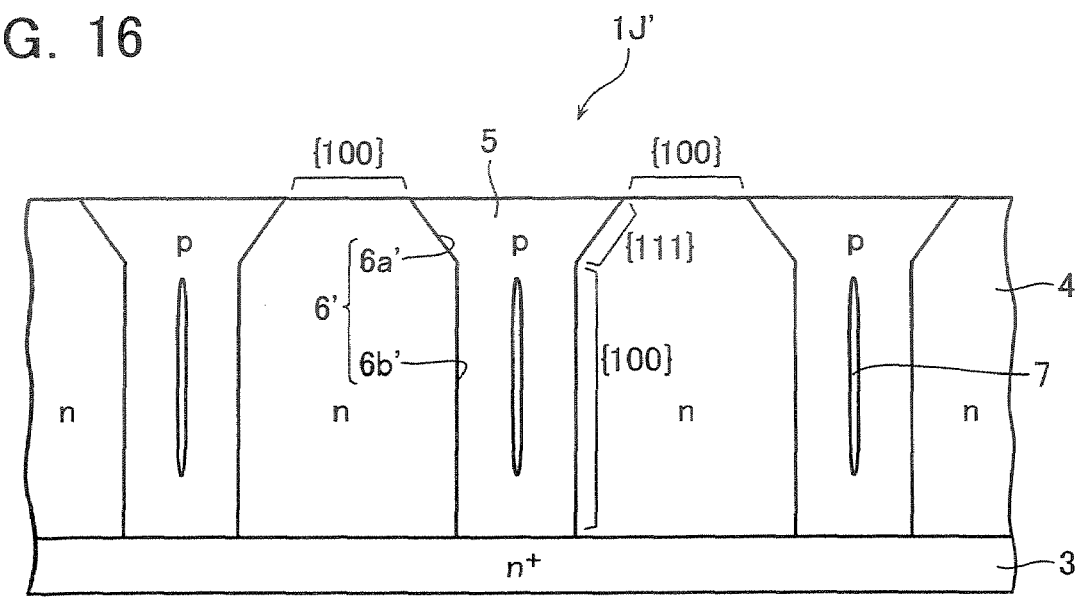
FIG. 16 is a vertical cross-sectional view of a semiconductor device in a step during fabrication according to a second embodiment of the present invention.

FIG. 16 is a vertical cross-sectional view showing a step during fabrication of a semiconductor device 1J' according to a second embodiment of the present invention. In the semiconductor device 1J according to the first embodiment, the trenches 6 are formed such that the upper stage sidewall 6a has the surface orientation of substantially {111} and the lower stage sidewall 6b has the surface orientation of substantially {110}. To the contrary, in the second embodiment, trenches 6 are formed such that an upper stage sidewall 6a' has a surface orientation of substantially {111} and a lower stage sidewall 6b' has a surface orientation of substantially {100}. The growth speed of silicon in epitaxial growth varies in relation to {100}>{110}>>{111}. Accordingly, if the upper stage sidewall has the surface orientation of substantially {111}, the surface orientation of the lower stage sidewall may be either substantially {110} or substantially {100} to exert the above-described effect.

Figure 17:
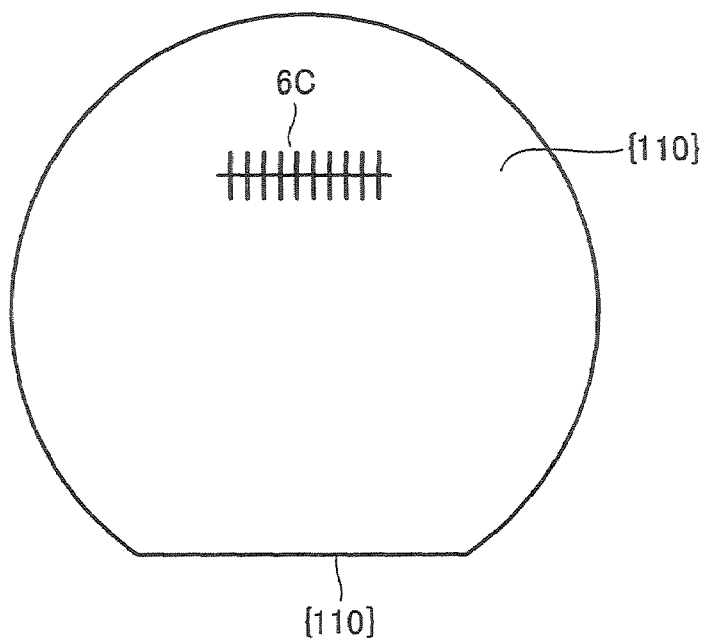
FIG. 17 is a plan view of a semiconductor substrate associated with the same device.

Such the semiconductor device 1J' can be produced by providing a semiconductor substrate having a surface orientation of substantially {110} associated with the principal plane and a surface orientation of substantially {110} associated with the orientation flat as shown in FIG. 17; forming a first semiconductor layer on the semiconductor substrate using a process of epitaxial growth; and forming trenches 6C having sidewalls almost perpendicular to the orientation flat direction.

As for the semiconductor substrate 3 used in this embodiment, the surface orientation of the principal plane is substantially {110} and the orientation flat direction is substantially {110}. The surface orientation of the semiconductor substrate is though not limited and any semiconductor substrate can be employed so long as the surface orientation of the upper stage sidewall of the trench is substantially {111} and the surface orientation of the lower stage sidewall is substantially {100}.

Third Embodiment

Figure 18:
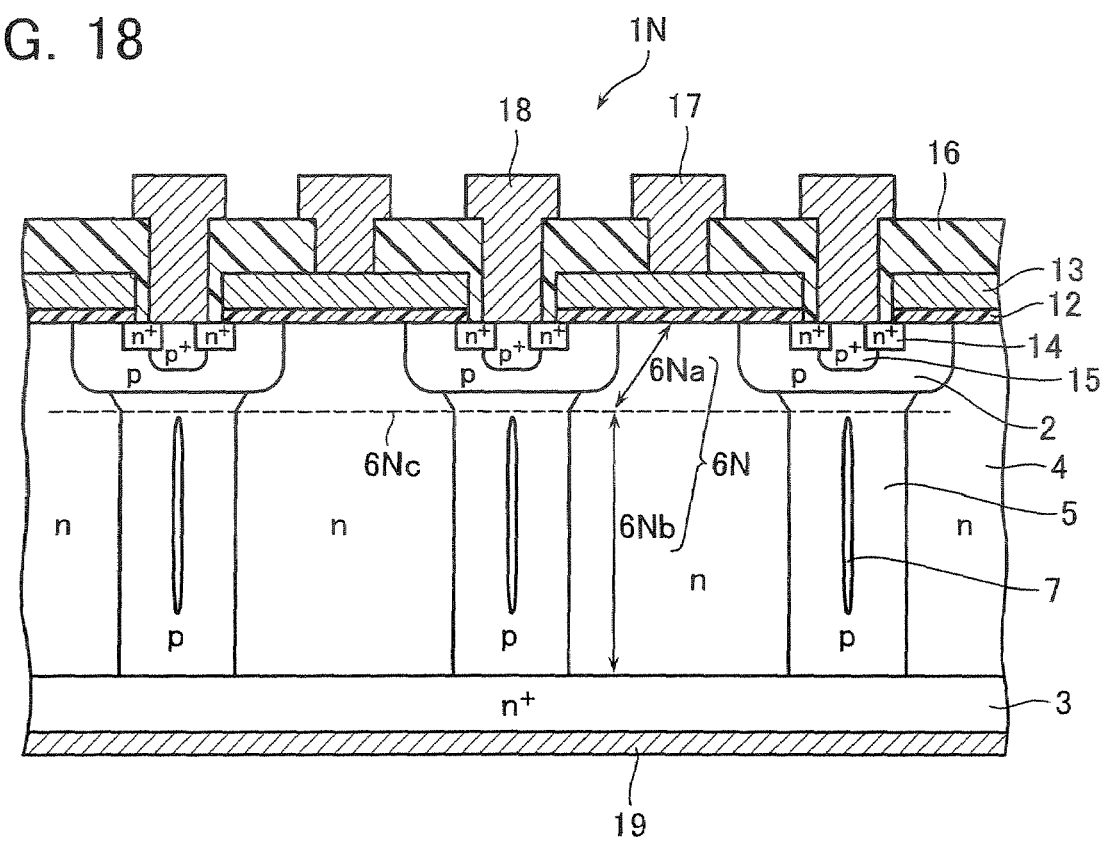
FIG. 18 is a vertical cross-sectional view of a semiconductor device according to a third embodiment.

FIG. 18 is a vertical cross-sectional view of a semiconductor device according to a third embodiment. In the semiconductor device 1 of the first and second embodiments, the p-type base region 2 is formed deep such that a lower end thereof locates beneath the boundary between the upper stage sidewall 6a and the lower stage sidewall 6b of the trench 6. To the contrary, in the semiconductor device 1N of the third embodiment, the p-type base region 2 is formed such that a lower end thereof locates above a boundary 6Nc between an upper stage sidewall 6Na and a lower stage sidewall 6Nb of a trench 6N. Such the structure can exert the above-described effect.

In the above embodiments the present invention is applied to the power MOSFET having the superjunction structure including a plurality of deep trenches formed therein. The first through third embodiments can also be applied to any semiconductor devices that can be produced by forming trenches in the first semiconductor layer and forming the second semiconductor layer in the trenches by epitaxial growth, thereby exerting the effect of the present invention.

Figure 19:
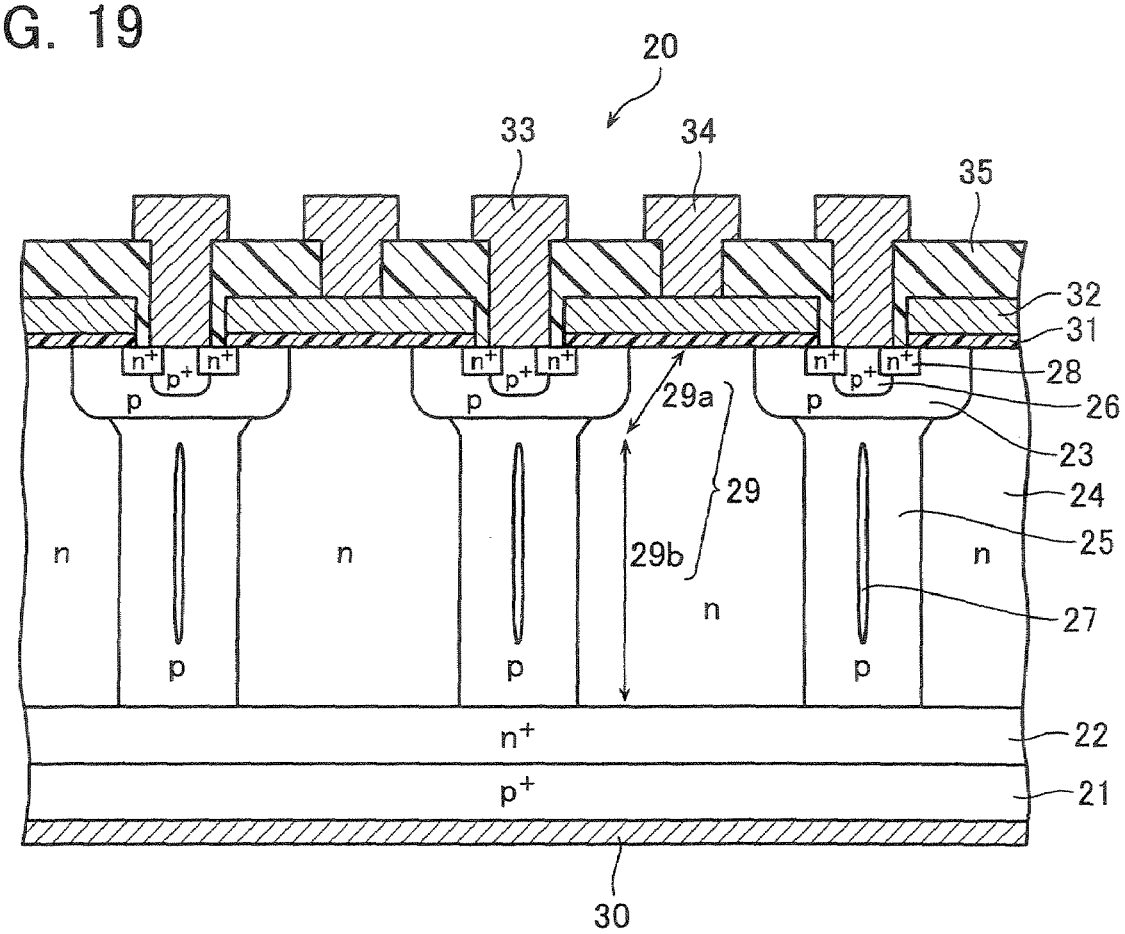
FIG. 19 shows a semiconductor device associated with the third embodiment applied to a vertical IGBT.

For example, the present invention can be applied to a vertical IGBT. FIG. 19 shows a semiconductor device associated with the third embodiment applied to the vertical IGBT. This semiconductor device 20 comprises a $p^+$-type collector layer 21, and an $n^+$-type first semiconductor layer 22 formed thereon. Formed in the first semiconductor layer 22 is a first semiconductor layer 24 that includes trenches 29 selectively formed therein. A second semiconductor layer 25 is buried inside the trenches 29. Like in the above-described embodiments, the trenches 29 are configured such that the growth speed of silicon in epitaxial growth from an upper stage sidewall 29a is made slower than the speed of growth from a lower stage sidewall 29b. This prevents a void 27 arising inside the trench 29 from appearing through the aperture of the trench 29. A p-type base region 23 is formed at an upper portion of the trench 29. A $p^+$-type contact layer 26 and an $n^+$-type emitter layer 28 are formed in the base region 23. Further, publicly known technologies are applied to form a collector electrode 30, a gate insulator 31, a gate electrode 32, a gate lead 34, an interlayer insulator 35, and an emitter electrode 33.

In the above embodiments the n-type semiconductor devices all having the n-type channel are described though the present invention is also applicable to p-type semiconductor devices having the p-type channel, needless to say.

As to the semiconductor materials of each embodiments, gallium arsenide (GaAs), silicon carbide (SiC), gallium nitride (GaN), indiumnitride (InN), silicon germanium (SiGe), germanium (Ge), or aluminum nitride (AlN) also may be used.

What is claimed is:
1. A semiconductor device, comprising:
   a semiconductor substrate;
   a first semiconductor layer of a first conductivity type formed on the semiconductor substrate and having a first trench formed therein, the first trench having an upper sidewall at an upper stage and a lower sidewall at a lower stage; and a second semiconductor layer of a second conductivity type, the second semiconductor layer being buried in the first trench in the first semiconductor layer, wherein the first trench has surface orientations including a first surface orientation of the upper sidewall made slower in epitaxial growth speed than a second surface orientation of the lower sidewall.

2. The semiconductor device according to claim 1, wherein the first trench is formed such that the first surface orientation of the upper sidewall is substantially {111} and the second surface orientation of the lower sidewall is substantially {100} or {110}.

3. The semiconductor device according to claim 1, further comprising:

a base region of the second conductivity type, the base region extending over the first semiconductor layer and the second semiconductor layer; and a first main electrode region of the first conductivity type formed adjacent to the base region.

4. The semiconductor device according to claim 2, wherein the first trench is formed such that the first surface orientation of the upper sidewall is {111}±6° and the second surface orientation of the lower sidewall is {100}±6° or {110}±6°.

5. The semiconductor device according to claim 3, wherein the first trench has a distance in a depth direction at the upper stage made shorter than a distance in a depth direction of the base region.

6. The semiconductor device according to claim 3, wherein the first trench has a distance in a depth direction at the upper stage made longer than a distance in a depth direction of the base region.

7. The semiconductor device according to claim 1, wherein the semiconductor device is a vertical MOSFET.

8. The semiconductor device according to claim 1, wherein the semiconductor device is a vertical IGBT.

9. The semiconductor device according to claim 1,
wherein the first semiconductor layer further comprises a second trench adjacent to the first trench therein, and when an interval between the first trench and the second trench is 12 µm or less, the distance in a depth direction at the upper stage is 0.5 µm or more and 5.0 µm or less.

10. The semiconductor device according to claim 1,
wherein a conductivity type of the semiconductor substrate is the first conductivity type.

11. The semiconductor device according to claim 1,
wherein a conductivity type of the semiconductor substrate is the second conductivity type.

* * * * *